United States Patent
Hasegawa

(10) Patent No.: US 8,158,276 B2
(45) Date of Patent: Apr. 17, 2012

(54) FEPTP-ALLOY MAGNETIC THIN FILM

(75) Inventor: Koichi Hasegawa, Kiyose (JP)

(73) Assignee: Ishifuku Metal Industry Co., Ltd., Tokyo (JP)

( * ) Notice: Subject to any disclaimer, the term of this patent is extended or adjusted under 35 U.S.C. 154(b) by 98 days.

(21) Appl. No.: 12/310,530

(22) PCT Filed: Aug. 3, 2007

(86) PCT No.: PCT/JP2007/065674
§ 371 (c)(1),
(2), (4) Date: Feb. 27, 2009

(87) PCT Pub. No.: WO2008/026439
PCT Pub. Date: Mar. 6, 2008

(65) Prior Publication Data
US 2010/0239890 A1      Sep. 23, 2010

(30) Foreign Application Priority Data

Aug. 31, 2006  (JP) ................... 2006-235810

(51) Int. Cl.
*G11B 5/66* (2006.01)
(52) U.S. Cl. .................. 428/836.1; 420/87; 420/466
(58) Field of Classification Search ........... None
See application file for complete search history.

(56) References Cited

U.S. PATENT DOCUMENTS

| | | | |
|---|---|---|---|
| 4,764,435 A | 8/1988 | Hosizaki et al. | |
| 6,666,930 B2 * | 12/2003 | Aoyama et al. | 148/306 |
| 2002/0098383 A1 | 7/2002 | Maeda et al. | |
| 2004/0110035 A1 | 6/2004 | Shin et al. | |
| 2004/0196593 A1 | 10/2004 | Yasui et al. | |
| 2006/0051622 A1 | 3/2006 | Shin et al. | |
| 2006/0188743 A1 | 8/2006 | Seki et al. | |

FOREIGN PATENT DOCUMENTS

| | | |
|---|---|---|
| JP | 2001-44025 | 2/2001 |
| JP | 2001-256631 | 9/2001 |
| JP | 3305790 | 5/2002 |
| JP | 2002-216330 | 8/2002 |
| JP | 2003-99920 | 4/2003 |
| JP | 2003-289005 | 10/2003 |
| JP | 2004-152471 | 5/2004 |
| JP | 2004-311607 | 11/2004 |
| JP | 2004-311925 | 11/2004 |
| JP | 2004-342159 | 12/2004 |
| JP | 2005-142550 | 6/2005 |
| JP | 2005-285207 | 10/2005 |
| JP | 2007-81308 | 3/2007 |
| JP | 2007-250977 | 9/2007 |

OTHER PUBLICATIONS

International Search Report dated Nov. 20, 2007 in the International (PCT) Application PCT/JP2007/065674 of which the present application is the U.S. National Stage.

English translation of PCT Written Opinion dated Mar. 12, 2009 in the International (PCT) Application PCT/JP2007/065674 of which the present application is the U.S. National Stage.

* cited by examiner

*Primary Examiner* — Holly Rickman
(74) *Attorney, Agent, or Firm* — Wenderoth, Lind & Ponack, L.L.P.

(57) ABSTRACT

Disclosed are magnetic thin films, sputtering targets and vapor deposition materials, each of which is composed of 40-60 at % of Pt, 40-60 at % of Fe, 0.05-1.0 at % of P and furthermore depending on the occasions, 0.4-19.5 at % of Cu and/or Ni.

16 Claims, No Drawings

FEPTP-ALLOY MAGNETIC THIN FILM

TECHNICAL FILED

This invention relates to magnetic thin film useful for making magnetic recording media represented by hard discs and the like, and to sputtering target materials and vapor deposition materials that can be used for production of the magnetic thin film.

BACKGROUND ART

For magnetic recording media represented by hard discs and the like, horizontal in-plane (or longitudinal direction) recording system has conventionally been adopted, but in such system disappearance of recording magnetization could occur as influenced by repulsion of magnetic poles, fluctuation of heat and so on, and high-density recording was difficult.

Due to these problems, perpendicular magnetic recording system is currently adopted, to effect higher density recording. In magnetic recording media of perpendicular magnetic recording system, frequently Co—Cr type alloy thin film such as of Co—Cr—Pt—Ta or the like is used, similarly to horizontal in-plane recording system, and coercive force of such a film is said to be normally 3-4 kOe.

Because Co—Cr type alloy thin film lacks thermal stability, it is attempted to prevent disappearance of recording magnetization caused by thermal fluctuation and the like, by adding thereto, for example, $SiO_2$ to form a granular structure.

On the other hand, in order to suppress disappearance of recording magnetization under higher heat fluctuation and the like, development of Pt—Fe alloy film having high coercive force and magnetic anisotropy is attempted (for example, see JP 3305790). This Pt—Fe alloy film is usually made by sputtering or vapor deposition, but the resultant alloy film is in irregular state having face centered cubic (fcc) structure and must be converted to regular state having face centered tetragonal (fct) structure, for obtaining the alloy film having sufficient coercive force. For bringing about the regular state, normally a heat treatment is given.

Conversion of such irregular state to regular state (which is hereafter referred to as "regularization") requires a heating treatment of the alloy film at temperatures not lower than 600° C. Hence aluminum or glass substrates which are deformed at 600° C. cannot be used, and a costly substrate such as of MgO, Si wafer, quartz and the like which are not deformed at 600° C. or higher must be used. Lowering of the regularization temperature, therefore, is in demand.

DISCLOSURE OF THE INVENTION

The main object of the present invention is to offer magnetic thin films, which can be regularized at lower temperatures than Pt—Fe binary alloy film, by commonly practiced film-forming method such as physical vapor phase growing processes including sputtering and vapor deposition, without any special treatment.

We have engaged in concentrative studies with the view to accomplish the above object, to now discover that a magnetic thin film, which can be regularized at temperatures lower than those for Pt—Fe binary alloys, can be obtained when a specific minor amount of P is added to Pt and Fe and alloyed; and that the phenomenon that addition of more than 1 at % of P conversely leads to rise in the regularization temperature can be improved when Cu and/or Ni are(is) further added, allowing regularization at lower temperatures. The present invention is thus completed.

Accordingly, therefore, the present invention provides a magnetic thin film and sputtering target or vapor deposition material, each of which is composed of 40-60 at % of Pt, 40-60 at % of Fe and 0.05-1.0 at % of P.

The invention also provides a magnetic thin film and sputtering target or vapor deposition material, each of which is composed of 40-60 at %, Pt, 40-60 at % of Fe, 0.05-2.0 at % of P and 0.4-19.5 at % of Cu and/or Ni.

The magnetic thin films provided by this invention can be easily formed by physical vapor phase growing method such as sputtering or vapor deposition.

Hereinafter the magnetic thin films of the invention and their production methods are explained in further details.

According to an embodiment of the present invention, a Pt—Fe—P ternary magnetic thin film is provided, which is formed by adding P to a Pt—Fe base binary alloy material composed of 40-60 at %, preferably 40-55% of Pt and 40-60 at %, preferably 45-60 at % of Fe, alloying them and making a thin film thereof. The amount of P to be added in that occasion can be within a range of 0.05—1.0 at %, preferably 0.1—0.8 at %. Where the used amount of Pt and Fe exceeds the above range, the resultant thin film may fail to be regularized even when heat-treated. Also where the amount of P added is less than 0.05 at %, the effect to lower the heat-treating temperature for the regularization cannot be obtained. Conversely, where it exceeds 1 at %, the heat-treating temperature for the regularization becomes higher than 500° C. and the effect of adding P is lost.

According to another embodiment of the present invention, Pt—Fe—P-(Cu and/or Ni) quaternary or quinary magnetic thin films are provided, which are formed by adding to Pt—Fe binary alloy material composed of 40—60 at %, preferably 40—55 at % of Pt and 40-60 at %, preferably 45—60 at % of Fe as the base, further P and Cu and/or Ni, alloying them and making thin films thereof. The amount of P to be added in that occasion can be within a range of 0.05-2.0 at %, preferably 0.1-1.5 at %, and that of Cu and/or Ni can be in total within a range of 0.4-19.5 at %, preferably 1.0-10 at %. Where the used amount of Pt and Fe exceeds the above range, the resultant thin film may fail to be regularized even when heat-treated. Also where the amount of P added is less than 0.05 at %, the effect to lower the heat-treating temperature for the regularization cannot be obtained. Conversely, where it exceeds 2 at %, the heat-treating temperature for the regularization becomes higher than 500° C. and the effect of adding P is lost. Furthermore where the added amount of Cu and/or Ni is less than 0.4 at %, the auxiliary effect of lowering the heating temperature for regularization cannot be obtained. Conversely, where it exceeds 19.5 at %, the resultant thin film may fail to be regularized even when heat-treated.

The magnetic thin films of the present invention can be produced by using ternary, quaternary or quinary alloys having the above compositions as sputtering target or vapor deposition material, and forming thin films thereof by such physical vapor phase growing method as sputtering, vapor deposition or ion plating.

Production of an alloy thin film by sputtering method can be carried out by, for example, high frequency (RF) sputtering process, direct current (DC) sputtering process, magnetron sputtering process or RF magnetron sputtering process. Specifically, for example, it can be carried out by setting a prescribed sputtering target and substrate for precipitating the thin film on a sputtering device, without heating the substrate or heating it to a temperature up to around 400° C.

The sputtering target to be used in that occasion may be a single target formed of a Pt—Fe—P ternary composition or of a Pt—Fe—P—(Cu and/or Ni) quaternary or quinary composition, each within the above-specified ratios; or may be a composite target, for example, in which at least one kind of alloy chip such as Fe—P alloy chip, Fe—Cu alloy chip, Fe—Ni alloy chip, Fe—Cu—P alloy chip or Fe—Ni—P alloy chip is mounted on Pt target, at such composition ratios as specified in the above. It is also possible to use Fe, Cu and Ni in the form of element, as a part of the composite target. Production of an alloy thin film by vapor deposition method can be carried out, for example, following electron beam vapor deposition process, by radiating a vacuum evaporation source comprising Pt, Fe, P, Cu and Ni at prescribed ratios with electron beam to cause evaporation of the metals under the heating, to deposit on the substrate Pt—Fe—P ternary alloy or Pt—Fe—P—(Cu and/or Ni) quaternary or quinary alloy as a thin film.

The alloy targets or alloy chips or vacuum evaporation sources which are used for above sputtering or vapor deposition can be prepared by suitably combining Pt, Fe, P, Cu and Ni at suitably prescribed ratios, melting them in an adequate metal smelting furnace such as a gas furnace, high frequency smelting furnace or the like, and where necessary casting the melt with mold and finishing the product by cutting. While air is sufficient as the melting atmosphere, an inert gas or vacuum may be used where necessary. The Pt, Fe, P, Cu and Ni which are used as the starting materials can be those available on the market in the form of grains, plates or blocks, usually those of at least 99.9%, in particular, at least 99.95%, in purity being preferred. Such alloy targets or alloy chips or vacuum evaporation sources that are used for above sputtering or vapor deposition can also be produced by sintering starting powder formed by mixing Pt, Fe, P, Cu and Ni at suitably prescribed ratios. An inert gaseous atmosphere or vacuum is adequate as the sintering atmosphere. The starting metal powders are to have a purity of at least 99.5%, those having a purity of at least 99.9% being particularly preferred.

On the other hand, as the substrate for precipitating the thin film, for example, quartz glass plate, crystallized glass plate, MgO plate, Si plate and the like can be named.

The thin film thus formed on the substrate can generally have a film thickness within a range of 5-200 nm.

The resultant thin film can be regularized by a heat treatment at temperatures ranging about 300-about 600° C., preferably about 350-about 500° C., and whereby the magnetic thin film having high coercive force can be obtained.

Those magnetic thin films according to the present invention possess high coercive force without further special treatment such as granulation, while they may be given a granular structure as combined with an inorganic matter such as $SiO_2$.

The magnetic thin films of the invention can be advantageously used for magnetic recording media which are required to have high coercive force, such as hard discs. Manufacture of magnetic recording media using the magnetic thin films as formed above can be carried out, for example, by forming a magnetic thin film of the present invention in the above-described manner on a non-magnetic substrate with a soft magnetic layer provided thereon, and further laminating thereon a protective layer, lubricating layer and the like, as necessity requires.

Hereinafter the present invention is explained in further details, referring to Examples.

EXAMPLES

Examples 1-6 and Comparative Examples 1-2

Composite targets were prepared by placing on a Pt target a Fe—P alloy chip, Fe—Cu—P alloy chip and/or Fe—Ni—P alloy chip. The targets were set on RF magnetron sputtering device and their films were made on soda glass substrates to provide the samples of Examples 1-6 and Comparative Examples 1-2 as shown in the following Table 1. In Example 1 and Comparative Example 2, Fe—P alloy chips were placed on the Pt target, and the substrate was heated to 200° C. Also in Examples 2-6 Fe—Cu—P alloy chips or Fe—Ni—P alloy chips were placed on the Pt target, and the substrate was not heated.

Whereas, in Comparative Example 1 a quartz glass was used as the substrate, and Pt-Fe alloy target was used to make a Pt—Fe binary alloy film.

Each a part of the resultant samples were turned into a solution with aqua regia, and analyzed with ICP emission spectroanalyzer. The results are shown in Table 1.

TABLE 1

| Sample | Composition (at %) |
|---|---|
| Example 1 | 48.8 Pt, 50.9 Fe, 0.3 P |
| Example 2 | 47.9 Pt, 48.1 Fe, 0.2 P, 3.8 Cu |
| Example 3 | 49.0 Pt, 42.8 Fe, 0.8 P, 7.4 Cu |
| Example 4 | 45.5 Pt, 50.0 Fe, 0.6 P, 3.9 Ni |
| Example 5 | 45.2 Pt, 45.5 Fe, 1.1 P, 8.2 Cu |
| Example 6 | 49.8 Pt, 45.6 Fe, 0.6 P, 4.0 Cu |
| Comparative Example 1 | 60.5 Pt, 39.5 Fe |
| Comparative Example 2 | 47.1 Pt, 51.7 Fe, 1.2 P |

Those thin films as shown in Table 1 which were given a film thickness ranging about 60-about 200 nm were heat-treated in vacuum at the temperatures as shown in the following Table 2, and their crystalline structures were analyzed by X-ray diffraction, to investigate presence of fct peaks and regularization temperature. The results are shown in Table 2.

TABLE 2

| Sample | Heat-treating Temp. (° C.) | Crystalline State |
|---|---|---|
| Example 1 | Immediately after film-making | fcc |
|  | 240 | fcc |
|  | 300 | fcc |
|  | 360 | fct |
| Example 2 | Immediately after film-making | fcc |
|  | 240 | fcc |
|  | 300 | fct |
|  | 360 | fct |
| Example 3 | Immediately after film-making | fcc |
|  | 240 | fcc |
|  | 300 | fct |
|  | 360 | fct |
| Example 4 | Immediately after film-making | fcc |
|  | 240 | fcc |
|  | 300 | fcc |
|  | 360 | fct |
| Example 5 | Immediately after film-making | fcc |
|  | 240 | fcc |
|  | 300 | fcc |
|  | 360 | fct |
| Example 6 | Immediately after film-making | fcc |
|  | 240 | fcc |
|  | 300 | fcc |
|  | 360 | fct |
| Comparative Example 1 | Immediately after film-making | fcc |
|  | 400 | fcc |
|  | 500 | fcc |
|  | 600 | fct |

TABLE 2-continued

| Sample | Heat-treating Temp. (° C.) | Crystalline State |
|---|---|---|
| Comparative Example 2 | Immediately after film-making | fcc |
| | 240 | fcc |
| | 300 | fcc |
| | 360 | fcc |
| | 475 | fcc |

(Note)
fcc: face centered cubit structure
fct: face centered tetragonal structure As is clear from Table 2, those thin films of Examples 1-6 were regularized at the heat-treating temperatures lower than 400° C. By contrast, the tin films of Comparative Examples 1-2 were not regularized at the heat-treating temperatures lower than 400° C. In Comparative Example 2 wherein the amount of P was more than 1.0 at %, the peak at face (111) became obscure and the film was not regularized by the heat treatment at temperatures not higher than 500° C. Whereas, the thin film of Example 5 in which the amount of P was similarly more than 1.0 at % was regularized at the heat-treating temperature lower than 400° C. It is thus confirmed: even when the amount of P is increased to exceed 1.0 at %, supplementary addition of Cu enables the film to be regularized at heat-treating temperature lower than 400° C.

Furthermore, magnetic characteristics (in-plane coercive force $Hc_{\parallel}$ and perpendicular coercive force $Hc_{\perp}$) of the thin films of the Examples and Comparative Example having fct crystalline state were measured with a vibration sample type magnetometer (VSM). The results are shown in the following Table 3.

TABLE 3

| Sample | Heat-treating Temp. (° C.) | In-plane Coercive Force, $Hc_{\parallel}$ (kOe) | Perpendicular Coercive Force $Hc_{\perp}$ (kOe) |
|---|---|---|---|
| Example 1 | 360 | 6.17 | 5.41 |
| Example 2 | 300 | 2.37 | 2.17 |
| | 360 | 6.90 | 6.38 |
| Example 3 | 300 | 1.58 | 1.26 |
| | 360 | 6.17 | 5.41 |
| Example 4 | 360 | 3.08 | 3.76 |
| Example 5 | 360 | 3.86 | 3.26 |
| Example 6 | 360 | 6.24 | 5.87 |
| Comparative Example 1 | 600 | 9.09 | 7.63 |

As is clear from Table 3, the thin films of Examples 1-6 had coercive force of at least 3 kOe at the heat-treating temperature lower than 400° C., and it is confirmed that they maintain high coercive force even when the heat-treating temperature is lowered.

This demonstrates the excellent effect that the application scope of substrate is enlarged for the thin films of Examples 1-6 which can be heat-treated at temperatures lower than 400° C., enabling the use of the substrates which are thermally deformed at 600° C., in comparison with the thin film of Comparative Example 1 which requires a heat treatment at temperatures not lower than 600° C. for obtaining the high coercive force.

Based on the results as shown in Table 3, grainer starting materials of Pt, Fe, P and Cu were mixed, aiming at obtaining a composition close to that of the sputtering targets of Examples 2 and 3 which showed high coercive force after the low temperature heat treatment. The mixture was melted in high frequency smelting furnace, the melt was casted with carbon mold and finished by cutting to provide a 3-inch sputtering target. The result of analyzing the resultant sputtering target is shown in the following Table 4.

TABLE 4

| Intended Composition | 48 Pt, 48 Fe, 0.5 P, 3.5 Cu (at %) |
|---|---|
| Analysis Result | 48.6 Pt, 47.8 Fe, 0.3 P, 3.3 Cu (at %) |

It can be understood from Table 4 that a sputtering target having the composition close to that aimed at could be produced. The resultant sputtering target was analyzed at plural sites, showing no variation in the composition, being homogeneous.

The invention claimed is:

1. A magnetic thin film composed of 40-60 at % of Pt, 40-60 at % of Fe and 0.05-0.8 at % of P.

2. A magnetic thin film according to claim 1, which contains 0.1-0.8 at % of P.

3. A magnetic thin film composed of 40-60 at % of Pt, 40-60 at % of Fe, 0.05-2.0 at % of P and 0.4-19.5 at % of Cu and/or Ni.

4. A magnetic thin film according to claim 3, which contains 0.1-1.5 at % of P.

5. A magnetic thin film according to claim 3, which contains 1.0-10 at % of Cu and/or Ni.

6. A magnetic thin film according to claim 1, which is formed by physical vapor phase growing method, sputtering method or vapor deposition method.

7. A magnetic recording medium formed with use of a magnetic thin film as described in claim 1.

8. A sputtering target or vapor deposition material composed of 40-60 at % of Pt, 40-60 at % of Fe and 0.05-0.8 at % of P.

9. A sputtering target or vapor deposition material composed of 40-60 at % of Pt, 40-60 at % of Fe, 0.05-2.0 at % of P and 0.4-19.5 at % of Cu and/or Ni.

10. A magnetic thin film according to claim 3, which is formed by physical vapor phase growing method, sputtering method or vapor deposition method.

11. A magnetic recording medium formed with use of a magnetic thin film as described in claim 2.

12. A magnetic recording medium formed with use of a magnetic thin film as described in claim 3.

13. A magnetic recording medium formed with use of a magnetic thin film as described in claim 4.

14. A magnetic recording medium formed with use of a magnetic thin film as described in claim 5.

15. A magnetic recording medium formed with use of a magnetic thin film as described in claim 6.

16. A magnetic recording medium formed with use of a magnetic thin film as described in claim 10.

* * * * *